(12) United States Patent
Koo et al.

(10) Patent No.: US 8,711,074 B2
(45) Date of Patent: Apr. 29, 2014

(54) FLAT PANEL DISPLAY

(75) Inventors: Jae-Bon Koo, Yongin-si (KR); Byoung-Deog Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1610 days.

(21) Appl. No.: 12/243,945

(22) Filed: Oct. 1, 2008

(65) Prior Publication Data

US 2009/0033231 A1    Feb. 5, 2009

Related U.S. Application Data

(62) Division of application No. 10/938,000, filed on Sep. 10, 2004, now Pat. No. 7,450,100.

(30) Foreign Application Priority Data

Sep. 18, 2003   (KR) .................................. 2003-64895

(51) Int. Cl.
G09G 3/36 (2006.01)

(52) U.S. Cl.
USPC ................... 345/92; 237/66; 237/72; 237/291

(58) Field of Classification Search
USPC .................................. 345/92; 257/66, 72, 291
See application file for complete search history.

(56) References Cited

U.S. PATENT DOCUMENTS

| 4,809,056 | A | 2/1989 | Shirato et al. |
| 4,906,587 | A | 3/1990 | Blake |
| 5,536,950 | A | 7/1996 | Liu et al. |
| 5,780,899 | A | * 7/1998 | Hu et al. ....................... 257/335 |
| 5,821,562 | A | 10/1998 | Makita et al. |
| 5,913,113 | A | 6/1999 | Seo |
| 6,136,655 | A | * 10/2000 | Assaderaghi et al. ........ 438/289 |

(Continued)

FOREIGN PATENT DOCUMENTS

| EP | 0 816 903 A1 | 1/1998 |
| JP | 11-54759 | 2/1999 |

(Continued)

OTHER PUBLICATIONS

Patent Abstracts of Japan, Publication No. 11-054759, dated Feb. 26, 1999, in the name of Takashi Yamada et al.

(Continued)

*Primary Examiner* — William Boddie
*Assistant Examiner* — Leonid Shapiro
(74) *Attorney, Agent, or Firm* — Christie, Parker & Hale, LLP

(57) ABSTRACT

A high-speed flat panel display having a long lifetime. Thin film transistors in a pixel portion having a plurality of pixels are contacted differently from thin film transistors in driving circuit portions for driving the pixels, thereby enhancing luminance uniformity and reducing power consumption. The thin film transistors each have a channel region and a body contact region for applying a predetermined voltage to the channel region. At least one thin film transistor in the pixel portion is a source-body contact thin film transistor having the body contact region connected to one of source and drain electrodes so that the predetermined voltage can be provided to the channel region. Each thin film transistor in the driving circuit portion is a gate-body contact thin film transistor having the body contact region connected to the gate electrode so that a predetermined voltage can be provided to the channel region.

6 Claims, 6 Drawing Sheets

(56) References Cited

U.S. PATENT DOCUMENTS

| | | | |
|---|---|---|---|
| 6,160,268 A | | 12/2000 | Yamazaki |
| 6,166,786 A | | 12/2000 | Ohkubo et al. |
| 6,307,322 B1 | * | 10/2001 | Dawson et al. ............ 315/169.1 |
| 6,580,408 B1 | * | 6/2003 | Bae et al. ......................... 345/76 |
| 6,653,700 B2 | | 11/2003 | Chau et al. |
| 6,670,655 B2 | * | 12/2003 | Lukes et al. ................... 257/217 |
| 7,038,276 B2 | | 5/2006 | Ker et al. |
| 7,064,388 B2 | | 6/2006 | Hayakawa et al. |
| 7,276,730 B2 | | 10/2007 | Yamazaki et al. |
| 2001/0052598 A1 | * | 12/2001 | Koga et al. ....................... 257/59 |
| 2002/0066901 A1 | | 6/2002 | Yamanaka et al. |
| 2002/0153569 A1 | | 10/2002 | Katayama |
| 2004/0206956 A1 | | 10/2004 | Yanai et al. |
| 2010/0255184 A1 | * | 10/2010 | Yamazaki et al. ............... 427/66 |

FOREIGN PATENT DOCUMENTS

| | | |
|---|---|---|
| JP | 2003-7719 | 1/2003 |
| JP | 2003-152184 | 5/2003 |
| JP | 2003-174172 | 6/2003 |
| KR | 1996-0030429 | 8/1996 |
| KR | 10-2003-0003043 A | 1/2003 |
| KR | 10-2003-0069852 A | 8/2003 |
| KR | 10-2004-0092916 | 11/2004 |
| KR | 10-2005-0018530 | 2/2005 |

OTHER PUBLICATIONS

Patent Abstracts of Japan, Publication No. 2003-007719, dated Jan. 10, 2003, in the name of Kazuki Kitamura et al.

Patent Abstracts of Japan, Publication No. 2003-152184, dated May 23, 2003, in the name of Yutaka Hayashi et al.

Patent Abstracts of Japan, Publication No. 2003-174172, dated Jun. 20, 2003, in the name of Takashi Yamada et al.

European Search Report dated Aug. 21, 2007, for EP 04090350.2, in the name of Samsung SDI Co., Ltd.

Korean Patent Abstracts, Publication No. 1020050018530, dated Feb. 23, 2005 in the name of Byoung Deog Choi et al.

Korean Patent Abstracts, Publication No. 1020040092916, dated Nov. 4, 2004 in the name of Seong Sik Bae et al.

Korean Notice of Allowance dated Oct. 13, 2008, for corresponding Korean Patent application 10-2007-0023628.

U.S. Office action dated Jan. 4, 2008, for related U.S. Appl. No. 11/510,052.

U.S. Office action dated May 14, 2008, for related U.S. Appl. No. 11/510,052, indicating relevance of listed Korean reference 10-1996-0030429 in this IDS.

English translation of Publication No. 10-1996-0030429, dated Aug. 17, 1996, in the name of Byeong-Seong Bae.

Korean Patent Abstracts, Publication No. 10-2003-0003043, dated Jan. 9, 2003, in the name of Naoki Makita et al.

Korean Patent Abstracts, Publication No. 10-2003-0069852, dated Aug. 27, 2003, in the name of Misako Nakazawa et al.

Office action dated Jan. 28, 2009 for related U.S. Appl. No. 11/760,869 listing cited references US 4,809,056; US 4,906,587 and US 5,913,113. KR 10-2003-0003043 and KR 10-2003-0069852 were previously cited in an IDS dated Jan. 15, 2009.

Office action dated Jan. 28, 2009 for related U.S. Appl. No. 11/760,876 listing cited references US 4,809,056; US 4,906,587 and US 6,653,700. KR 10-2003-0003043 and KR 10-200-30069852 were previously cited in an IDS dated Jan. 15, 2009.

Office action dated Feb. 10, 2009 for related U.S. Appl. No. 11/760,864 listing cited references US 4,809,056; US 6,653,700; US 5,536,950 and US 6,160,268 B2. KR 10-20030003043 and KR 10-2003-0069852 were previously cited in an IDS dated Jan. 15, 2009.

* cited by examiner

FLAT PANEL DISPLAY

CROSS-REFERENCE TO RELATED APPLICATION

This application is a divisional of U.S. patent application Ser. No. 10/938,000, filed Sep. 10, 2004 now U.S. Pat. No. 7,450,100 which claims priority to and the benefit of Korean Patent Application No. 2003-64895, filed Sep. 18, 2003 in the Korean Intellectual Property Office, the disclosure of which is incorporated herein by reference in its entirety.

BACKGROUND OF THE INVENTION

1. Field of the Invention

The present invention relates to a flat panel display and, more particularly, to a high-speed flat panel display having a long lifetime in which thin film transistors of a pixel portion and driving circuit portions have different body contact structures.

2. Description of the Related Art

Generally, an active matrix organic light emitting diode (AMOLED) display includes a pixel portion in which an array of thin film transistors is arranged, and a data driving circuit portion and a gate driving circuit portion for driving the array of thin film transistors in the pixel portion.

In a conventional AMOLED display, the thin film transistors in the pixel portion and thin film transistors in the data or gate driving circuit portion are all composed of polysilicon thin film transistors. Therefore, in a 180 ppi or higher resolution AMOLED display, if the pixel portion and the driving circuit portions are composed of the polysilicon thin film transistors, a high-speed operating characteristic of the driving circuit portions could be obtained because of high mobility of the thin film transistors. However, because an on-current is very high, the amount of a current flowing through EL elements in the pixel portion exceeds a limit value, and thus luminance per unit area increases, which shortens the lifetime of the EL elements.

Meanwhile, when the pixel portion and the driving portions are composed of thin film transistors with low mobility to maintain a suitable on-current characteristic, it results in a relatively low on-current and thus causes appropriate luminance, which overcomes the shortened lifetime problem of the EL element, but it cannot support a high-speed operating characteristic of the driving circuit portions.

SUMMARY OF THE INVENTION

Accordingly, in exemplary embodiments of the present invention, a high-speed flat panel display having a long lifetime is provided. The flat panel display has a pixel portion and driving circuit portions that are composed of thin film transistors having different body contacts, thereby enhancing luminance uniformity and reducing power consumption. Such a flat panel display may be suitable for small size displays having high resolution.

In an exemplary embodiment of the present invention, a flat panel display including a pixel portion in which a plurality of pixels are arranged; and driving circuit portions for driving the pixels, is provided. The pixel portion and the driving circuit portions each include thin film transistors each having a channel region and a body contact region for applying a predetermined voltage to the channel region. The body contact region of at least one of the thin film transistors in the pixel portion is contacted differently from the body contact region of the thin film transistors in the driving circuit portions.

The at least one of the thin film transistors in the pixel portion may be a source-body contact thin film transistor and may further include a gate electrode, a source electrode, a drain electrode and source and drain regions connected, respectively, to the source and drain electrodes. The body contact region of the at least one of the thin film transistors may be connected to one of the source and drain electrodes so that the predetermined voltage from the connected electrode can be provided to the channel region. The body contact region may include an impurity region which is doped with an impurity of an opposite conductivity type from impurities in the source and drain regions.

Each of the thin film transistors in the driving circuit portions may be a gate-body contact thin film transistor, and may further include a gate electrode, a source electrode, a drain electrode, and source and drain regions connected, respectively, to the source and drain electrodes. The body contact region of each of the thin film transistors in the driving circuit portions may be connected to the gate electrode so that the predetermined voltage from the gate electrode can be provided to the channel region. The body contact region may include an impurity region which is doped with an impurity of opposite conductivity type from impurities in the source and drain regions.

The thin film transistors in the pixel portion may include a first thin film transistor which is switched by a gate driving signal to deliver a data signal, and a second thin film transistor for driving an EL element according to the data signal delivered via the first thin film transistor. The body contact region of at least one of the first thin film transistor and the second thin film transistor may be contacted differently from the body contact region of the thin film transistors in the driving circuit portions.

The thin film transistors in the pixel portion may be NMOS or PMOS thin film transistors and the thin film transistors in the driving circuit portions may be PMOS or NMOS thin film transistors. Alternatively, each of the thin film transistors in the pixel portion may be either an NMOS thin film transistor or a PMOS thin film transistor, and each of the thin film transistors in the driving circuit portions may be a PMOS thin film transistor or an NMOS thin film transistor based on a CMOS technology.

In another exemplary embodiment of the present invention, there is provided a flat panel display including a pixel portion in which a plurality of pixels are arranged, and driving circuit portions for driving the pixels. The pixel portion includes thin film transistors each having a substantially uniform output current over a predetermined range of input voltages, and the driving circuit portions include thin film transistors each having a suitable ON/OFF characteristic at a low input voltage.

Each of the thin film transistors in the pixel portion may be a source-body contact thin film transistor and may include an active layer having a channel region and a body contact region for providing a predetermined voltage to the channel region, a gate electrode, a source electrode and a drain electrode. The body contact region may be connected to one of the source electrode and the drain electrode so that the predetermined voltage from the connected electrode can be provided to the channel region. A drain current outputted via the drain electrode may be substantially uniform with respect to an input voltage applied to the drain electrode.

Each of the thin film transistors in the driving circuit portions may be a gate-body contact thin film transistor, and may include an active layer having a channel region and a body contact region for providing a predetermined voltage to the channel region, a gate electrode, a source electrode and a drain electrode. The body contact region may be connected to the gate electrode so that the predetermined voltage from the gate electrode can be provided to the channel region. A drain current outputted via the drain electrode may have a suitable ON/OFF characteristic with respect to an input voltage applied to the gate electrode.

In yet another exemplary embodiment of the present invention, a flat panel display includes a pixel portion including a plurality of pixel circuits, each comprising at least one first thin film transistor having a first body contact region, a first channel region connected to the first body contact region, a source electrode and a drain electrode, wherein the first body contact region is connected to the source electrode or the drain electrode, such that a first predetermined voltage applied at the connected electrode is applied to the first channel region through the first body contact region; and a driving circuit portion for driving the pixel circuits, the driving circuit portion including a plurality of second thin film transistors, each having a second body contact region, a second channel region connected to the second body contact region, and a gate electrode, wherein the second body contact region is connected to the gate electrode, such that a second predetermined voltage applied at the gate electrode is applied to the second channel region through the second body contact region.

BRIEF DESCRIPTION OF THE DRAWINGS

The above and other features in exemplary embodiments of the present invention will be described in reference to certain exemplary embodiments thereof with reference to the attached drawings in which.

DETAILED DESCRIPTION

Figure 1:
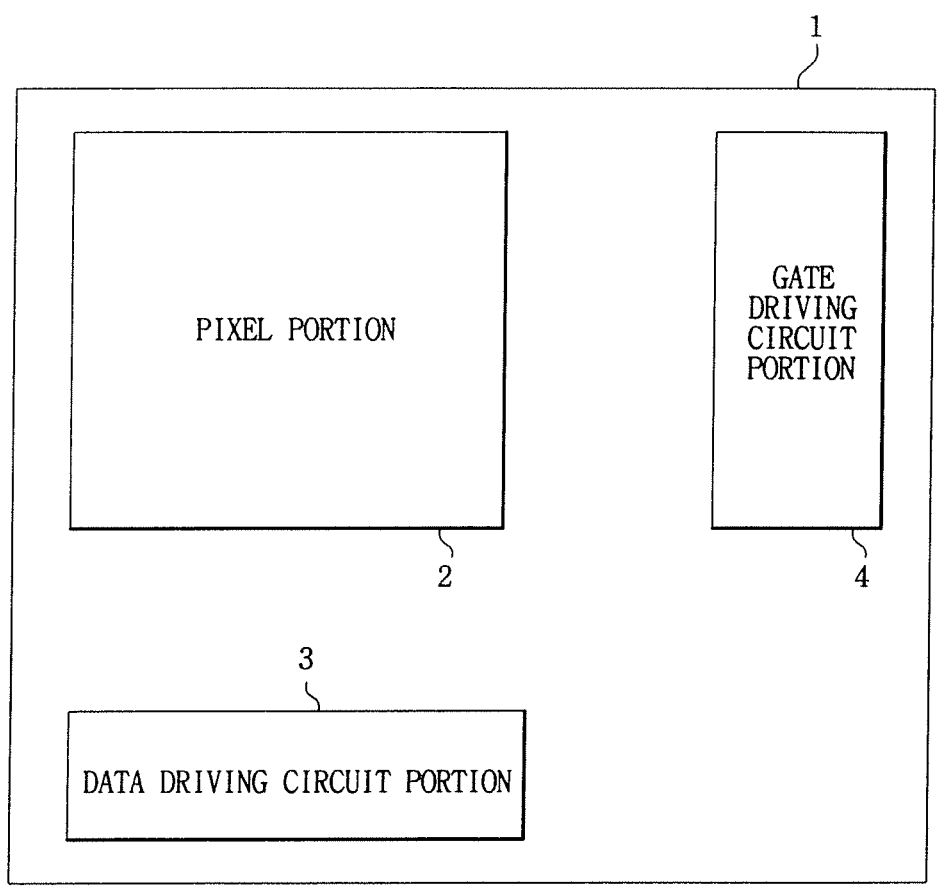
FIG. 1 is a block diagram of an organic light emitting diode (OLED) display device according to an exemplary embodiment of the present invention.

Referring to FIG. 1, an OLED display device includes a pixel portion 2 in which a plurality of pixels are arranged in a matrix form, and driving circuit portions for driving the pixel portion 2 on an insulating substrate 1. Although the pixel portion 2 is not shown in detail in FIG. 1, a plurality of gate lines, a plurality of data lines, a plurality of power lines, and a plurality of pixels connected to the lines are arranged in a matrix form. Each pixel is basically composed of an electroluminescent (EL) element, a driving transistor for supplying a driving current according to a data signal from a data line to the EL element, a switching transistor for delivering the data signal to the driving transistor in response to a scan signal applied to a gate line, a capacitor for storing the data signal, and the like.

The driving circuit portions for driving the pixels in the pixel portion 2 include a gate driving circuit portion 4 for providing a scan signal for driving the gate lines in the pixel portion 2, and a data driving circuit portion 3 for supplying the data signals to data lines in the pixel portion 2.

In an exemplary embodiment of the present invention, each of the thin film transistors in the pixel portion 2 is a source-body contact thin film transistor, and each of the thin film transistors of the driving circuit portions 3 and 4 is a gate-body contact thin film transistor. The source-body contact thin film transistor has a body contact structure including a body contact region separately formed from the source and drain regions on an active layer. The body contact region is connected to either the source region or the drain region, for example, the source region. The gate-body contact thin film transistor has a body contact structure including a body contact region separately formed from the source and drain regions on the active layer. The body contact region is connected to the gate electrode.

Since identical drain currents can be obtained over a wide range of drain voltages in the source-body contact thin film transistor by reducing a kink effect, the source-body contact thin film transistor is suitable for thin film transistors making up the pixel portion 2. On the other hand, since the gate-body contact thin film transistor can implement an ON/OFF characteristic at a low gate voltage, it is suitable for thin film transistors making up the driving circuit portions 3 and 4.

An exemplary source-body contact thin film transistor that can be used as the thin film transistors in the pixel portion 2 is described in Korean Patent Application No. 2003-0027339, the entire content of which is incorporated by reference herein. Further, an exemplary gate-body contact thin film transistor that can be used as the thin film transistors of the driving circuit portions 3 and 4 is described in Korean Patent Application No. 2003-0056594.

Figure 2:
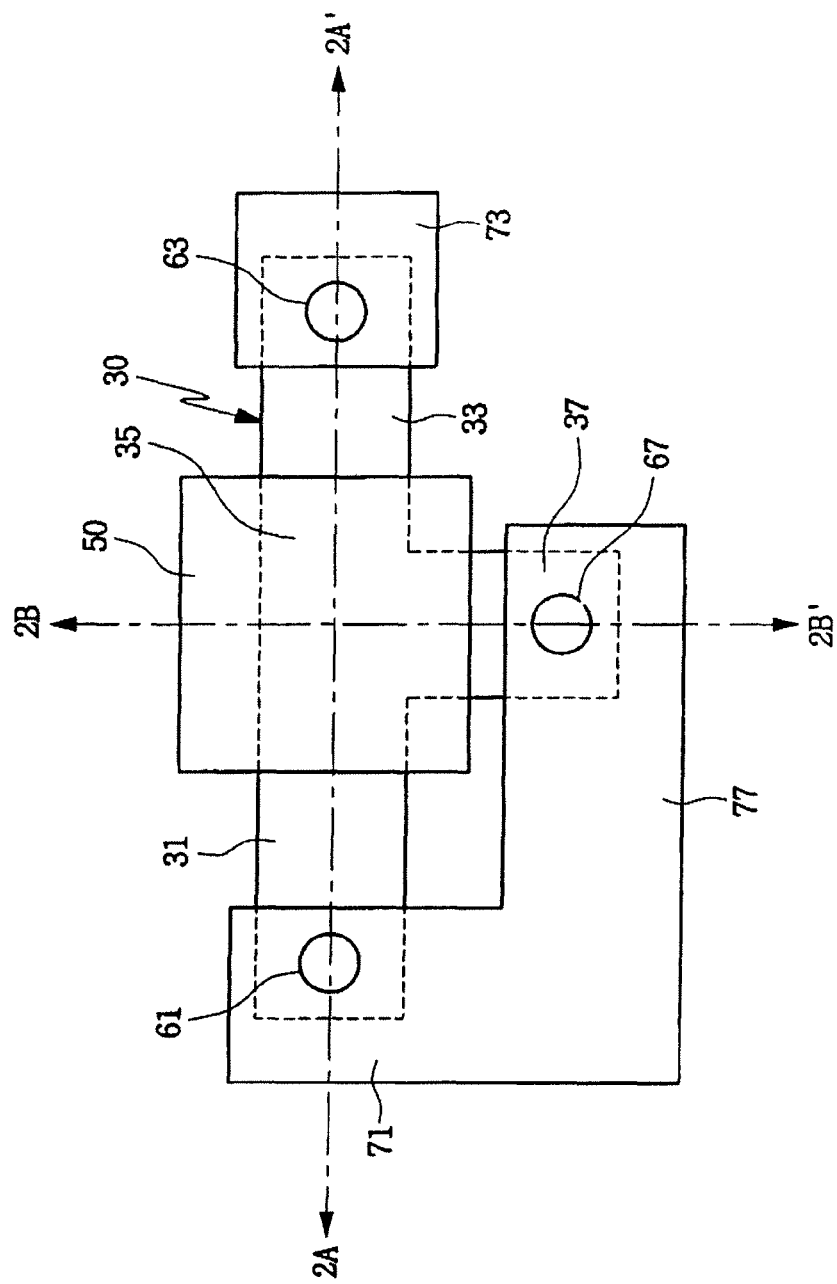
FIG. 2 is a plan view of a thin film transistor in a pixel portion in an organic light emitting diode according to an exemplary embodiment of the present invention.
Figure 3A:
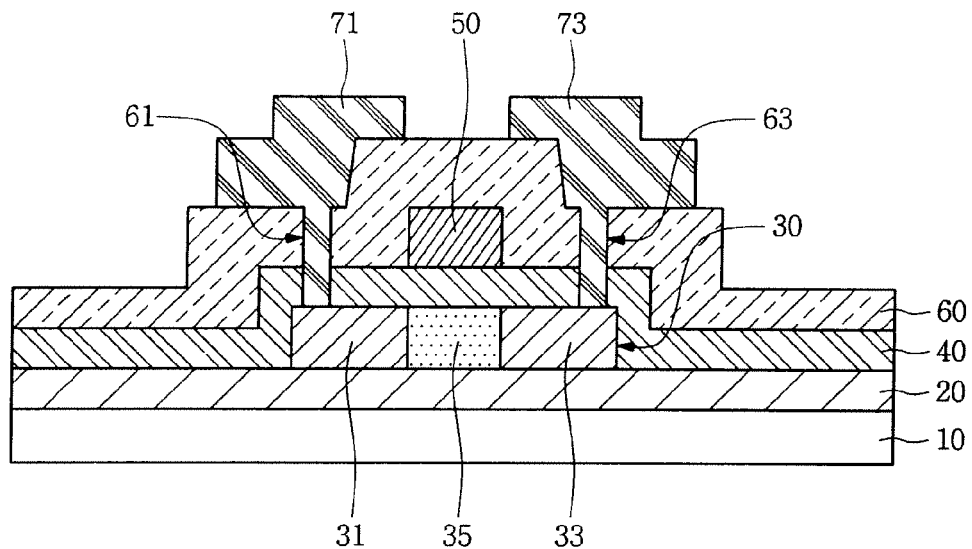
FIG. 3A is a cross-sectional view of the thin film transistor in the pixel portion taken along line 2A-2A' of FIG. 2.
Figure 3B:
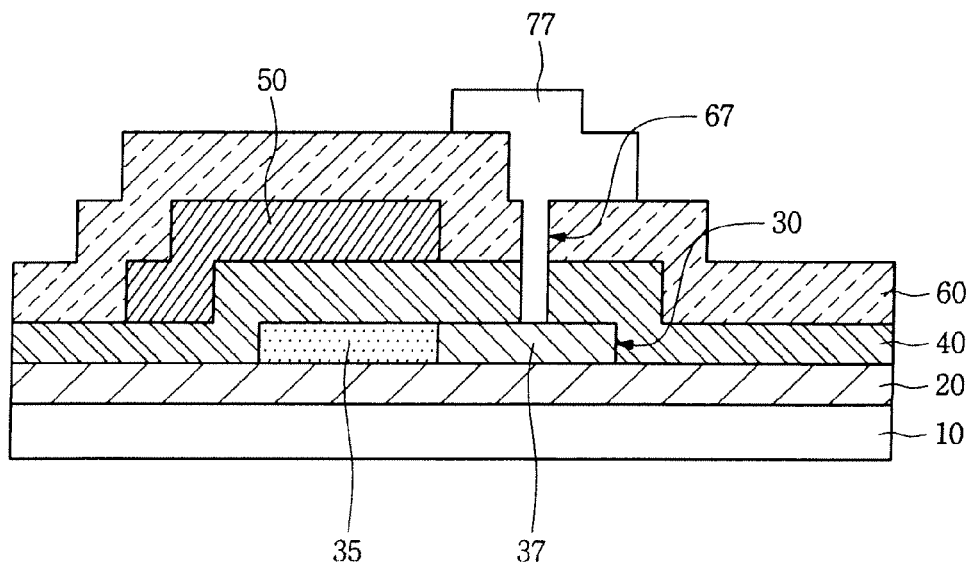
FIG. 3B is a cross-sectional view of the thin film transistor in the pixel portion taken along line 2B-2B' of FIG. 2.

FIG. 2 is a plan view of a source-body contact thin film transistor making up the pixel portion in the OLED display device according to an exemplary embodiment of the present invention as shown in FIG. 1, and FIGS. 3A and 3B show cross-sectional structures taken along lines 2A-2A' and 2B-2B' of FIG. 2, respectively.

Referring to FIG. 2 and FIGS. 3A and 3B, a source-body contact thin film transistor used in an exemplary embodiment of the present invention includes an active layer 30, a gate electrode 50, and source and drain electrodes 71 and 73. The source-body contact thin film transistor is formed on an insulating substrate 10, and an insulation layer 60 separates the gate electrode 50 from the source and drain electrodes 71 and 73. The active layer 30 includes source and drain regions 31 and 33 with a channel region 35 formed therebetween, and a body contact region 37 separately formed from the source and drain regions 31 and 33.

The gate electrode 50 is formed corresponding to the channel region 35 of the active layer 30. The source electrode 71 is formed corresponding to the source region 31 and is electrically connected to the impurity region for the source 31 via a contact 61. The drain electrode 73 is formed corresponding to the drain region 33, and is electrically connected to the impurity region for the drain 33 via a contact 63. Meanwhile, a connection wiring 77 is formed corresponding to the body contact region 37, and it electrically connects the body contact region 37 to the source electrode 71 via a contact 67.

Further, although the connection wiring 77 for applying a power to the body contact region 37 is formed integrally with the source electrode 71 in the described exemplary embodiment, it may be separated from the source electrode 71, and the same power as that applied to the source electrode 71 may be applied to it. Further, although the connection wiring 77 is formed to connect to the source electrode 71, it may be formed instead to connect to the drain electrode 73.

In the source-body contact thin film transistor having the above-stated structure according to the exemplary embodiment of the present invention, hot carriers generated during normal operation at an interface between the drain region 33 and the channel region 35 by a lateral electric field in the drain region, are forced to go out through the body contact region 37. As a result, the hot carriers are prevented from moving into the source region 31, and thus a kink effect is suppressed.

Figure 4A:
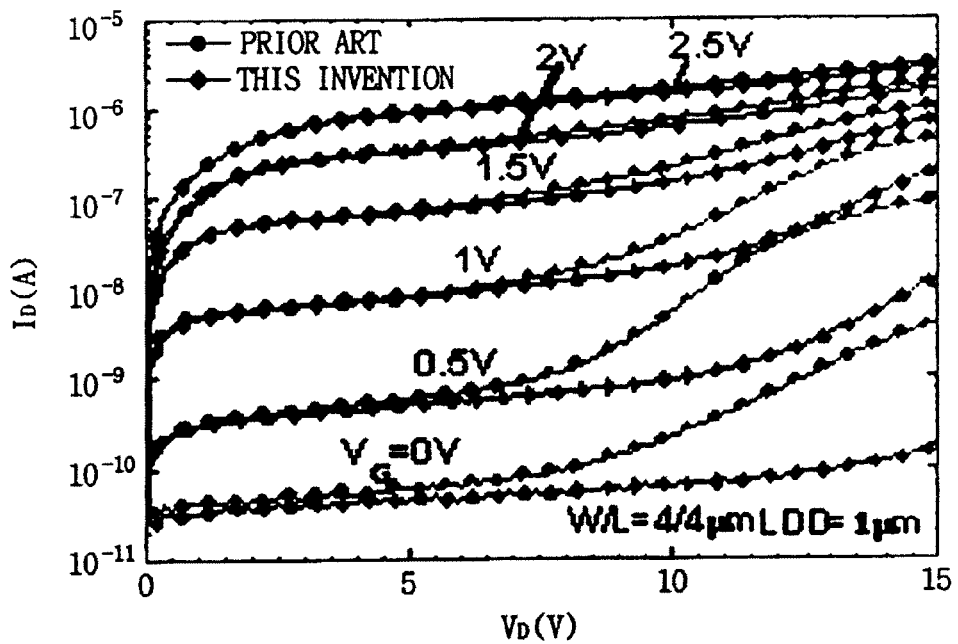
FIGS. 4A and 4B are graphs illustrating a relationship between a drain voltage and a drain current in the thin film transistor of the pixel portion shown in FIG. 2.
Figure 4B:
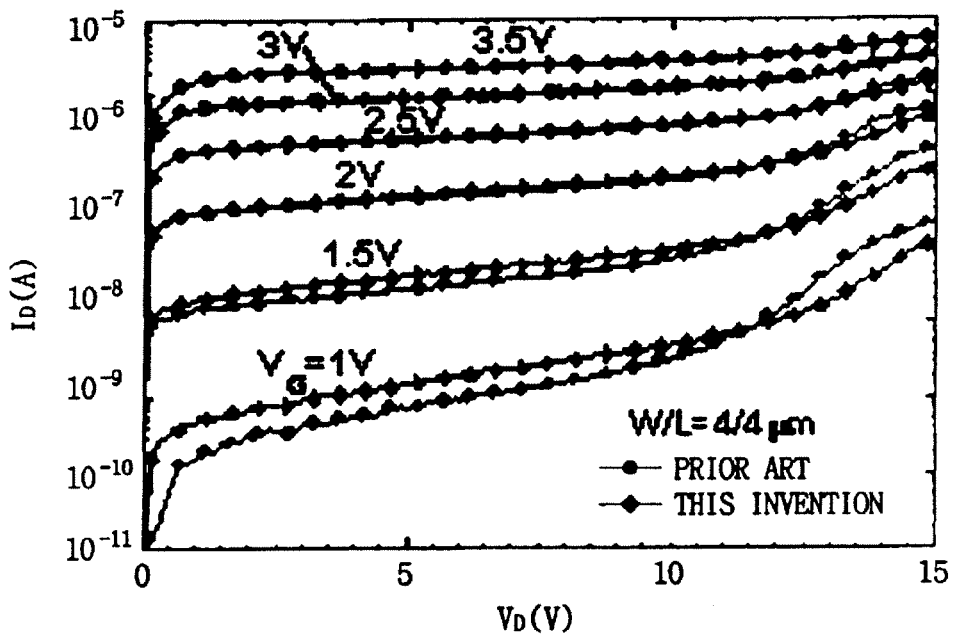

FIGS. 4A and 4B are graphs that show operating characteristics of a conventional floating body thin film transistor (TFT) and a TFT having a body contact region used in the described exemplary embodiment. FIG. 4A shows an $I_D$-$V_D$ characteristic of the present invention and the prior art in an n type thin film transistor in which W/L=4 μm/4 μm and the width of a Lightly Doped Drain (LDD) region is 1 μm. FIG. 4B shows an $I_D$-$V_D$ characteristic of the described exemplary embodiment and the prior art in a p type thin film transistor in which W/L=4 μm/4 μm.

Referring to FIGS. 4A and 4B, it can be seen that the source-body contact thin film transistor used in the described exemplary embodiment has a better kink free characteristic as compared to a conventional TFT in which the active layer thereof is floated. At this time, a difference in the $I_D$-$V_D$ characteristic between the n type TFT and the p type TFT results because an impact ionization characteristic of holes is less than that of electrons.

Figure 5:
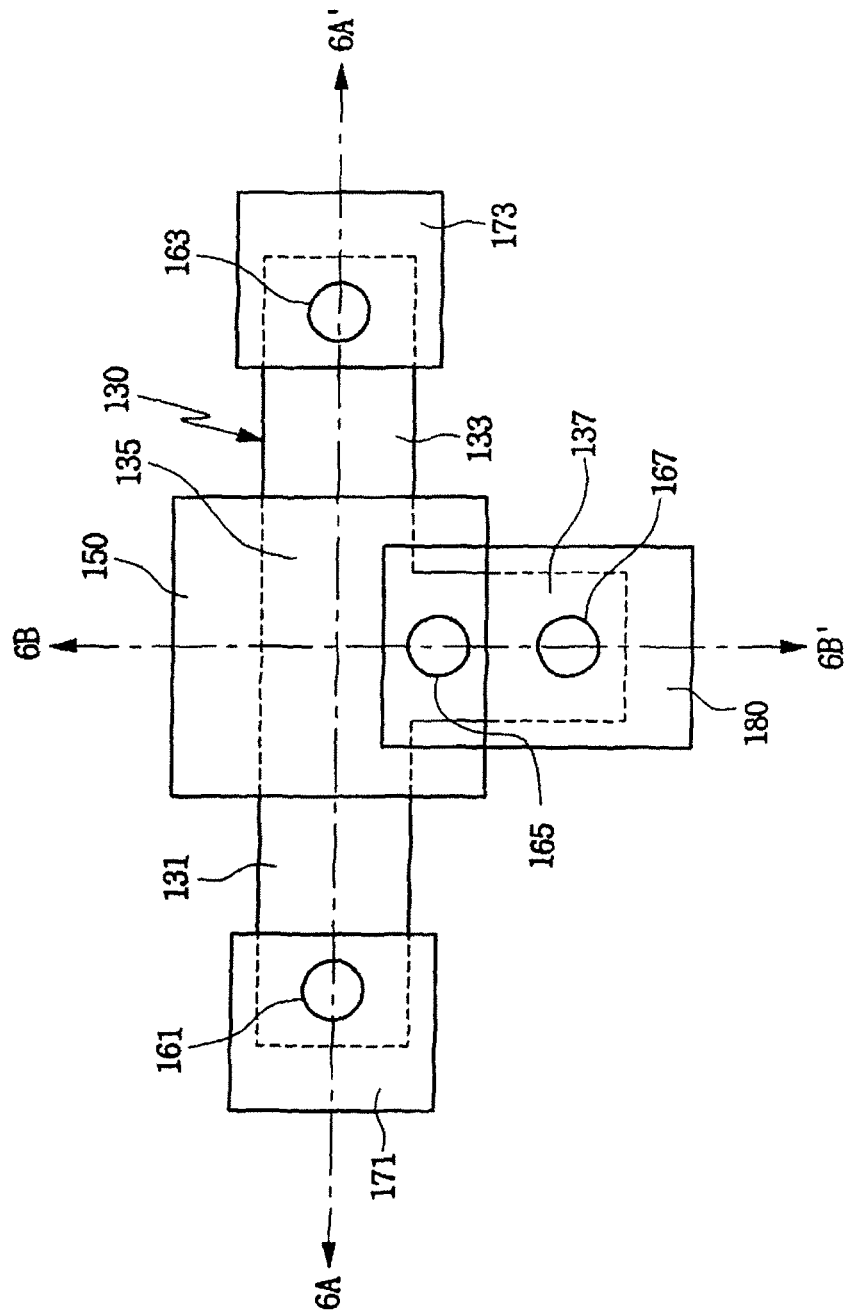
FIG. 5 is a plan view of a thin film transistor of a driving circuit portion in an organic light emitting diode according to an embodiment of the present invention.

FIG. 5 is a plan view of a gate-body contact thin film transistor used in a driving circuit portion in an OLED display device according to an exemplary embodiment of the present invention.

Referring to FIG. 5, the gate-body contact thin film transistor used in an exemplary embodiment of the present invention includes an active layer 130, a gate electrode 150, and source and drain electrodes 171 and 173. The active layer 130 includes source and drain regions 131 and 133 with a channel region 135 formed therebetween, and a body contact region 137 separately formed from the source and drain regions 131 and 133.

The gate electrode 150 is formed corresponding to the channel region 135 of the active layer 130. The source electrode 171 is formed corresponding to the source region 131 and is electrically connected to the impurity region for the source 131 via a contact 161. The drain electrode 173 is formed corresponding to the drain region 133, and is electrically connected to the impurity region for the drain 133 via a contact 163.

Further, a connection wiring 180 is formed corresponding to the body contact region 137. The connection wiring 180 couples the body contact region 137 to the gate electrode 150 through a contact 165 formed on the gate electrode 150 and a contact 167 formed on the body contact region 137. The connection wiring 180 is formed of the same material as that of the source or drain electrode 171 or 173, and has an island shape connection pattern.

Further, in the exemplary embodiment of the present invention, the connection wiring 180 for applying power to the body contact region 137 is electrically connected to the gate electrode 150 via the contact 165, which enables a low voltage drive, thereby reducing the swing width of a threshold voltage and deriving a high drain current at a low gate voltage.

Figure 6A:
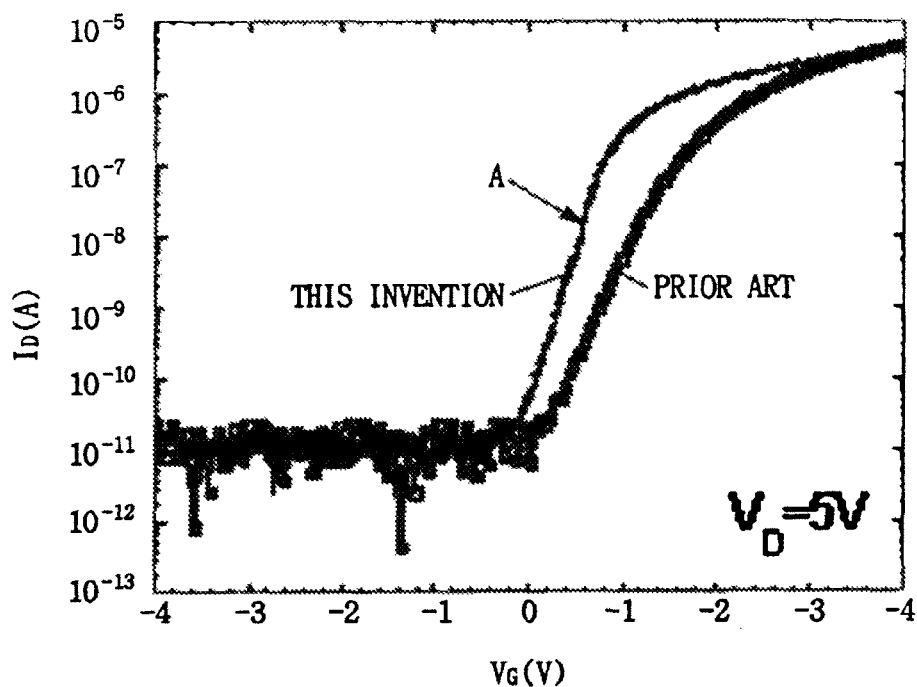
FIGS. 6A and 6B are graphs illustrating a relationship between a gate voltage and a drain current in the thin film transistor of the driving circuit portion shown in FIG. 5.
Figure 6B:
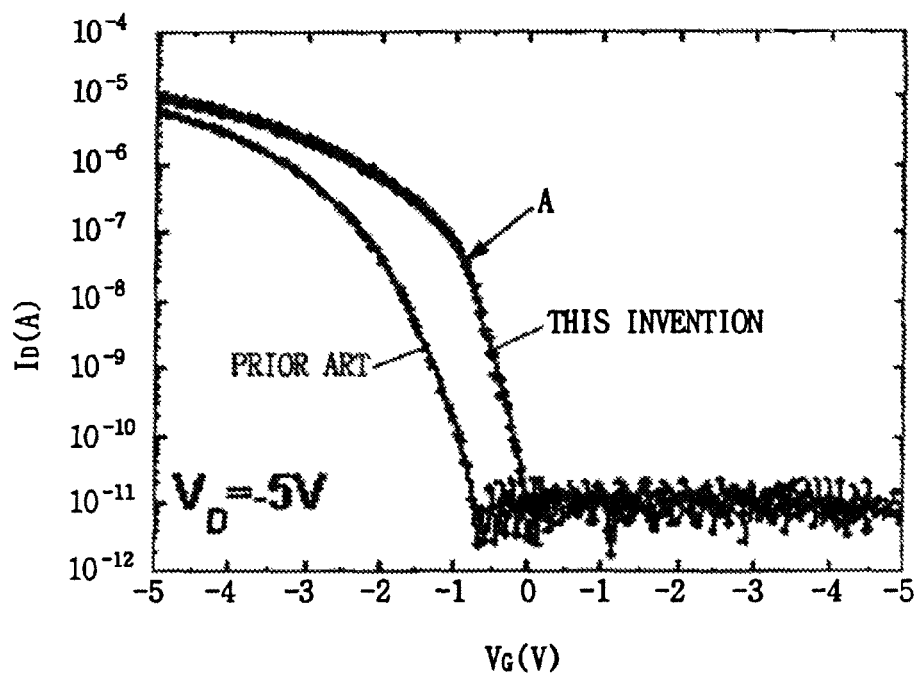

FIGS. 6A and 6B are graphs that show an operating characteristic of a conventional floating body thin film transistor and a gate-body contact thin film transistor used in the present invention. FIG. 6A illustrates a drain current $I_D$ with respect to a gate voltage $V_G$ in the case where each of the floating body thin film transistor and the gate-body contact thin film transistor is an NMOS transistor, and FIG. 6B illustrates a drain current $I_D$ with respect to a gate voltage $V_G$ in the case where each of the floating body thin film transistor and the gate-body contact thin film transistor is a PMOS transistor.

Referring to FIGS. 6A and 6B, since a threshold voltage of the gate-body contact thin film transistor has a steeper slope than that of the floating body thin film transistor, an ON/OFF characteristic can be obtained at a low gate voltage.

Accordingly, in the exemplary embodiment of the present invention, the driving circuit portions 3 and 4 are composed of the gate-body contact thin film transistor shown in FIG. 4, and the pixel portion 2 is composed of the source-body contact thin film transistor as shown in FIG. 2 and FIGS. 3a and 3b, thereby obtaining a high-speed operating characteristic, while allowing a low voltage drive at the same time. Further, since a substantially uniform current flows through the EL element in the pixel portion, it is possible to obtain a substantially uniform luminance characteristic and to expand the lifetime thereof.

In the exemplary embodiment of the present invention, the source and drain regions and the body contact region are of different conductive types. For example, if the source and drain regions are composed of a high concentration n-type impurity region, the body contact region is composed of a high concentration p-type impurity region. On the other hand, if the source and drain regions are composed of the high concentration p-type impurity region, the body contact region is composed of the high concentration n-type impurity region. In the described exemplary embodiment, the channel region in the active layer is an intrinsic region in which first or second conductive type impurities are not doped.

Further, although forming the body contact region in the thin film transistor in which the source and drain regions are composed of high concentration impurity regions has been described in reference to the exemplary embodiments of the present invention, the principles of the present invention are applicable to a thin film transistor in which source and drain regions of the transistor have an LDD structure of a high concentration impurity region and a low concentration impurity region.

In addition, the source-body contact thin film transistor and the gate-body contact thin film transistor in exemplary embodiment of the present invention are not limited to the illustrated structures and may have either or both a structure in which the source and the body contact region are interconnected and a structure in which the gate and the body contact region are interconnected.

In the exemplary embodiment of the present invention, it is possible to use the source-body contact thin film transistor as both a switching transistor and a driving transistor of the pixel portion. Alternatively, it is possible to use the source-body contact as either a switching transistor or a driving thin film transistor, but not both. By way of example, the driving transistor may be a source-body contact thin film transistor, while the switching transistor is a conventional floating body thin film transistor.

According to the above-described embodiments of the present invention, the thin film transistor in the pixel portion is a source-body contact thin film transistor having an excellent drain current characteristic, and the thin film transistor in the driving circuit portion is a gate-body contact thin film transistor having an excellent ON/OFF characteristic at a low voltage, thereby maintaining a substantially uniform current flowing through an EL element to obtain a substantially uniform luminance characteristic as well as obtaining a high-speed operating characteristic, and extending the lifetime of the EL element.

Although the present invention has been described with reference to certain exemplary embodiments thereof, it will be understood by those skilled in the art that various modifications and variations can be made to the described exemplary embodiments without departing from the spirit or scope of the present invention defined in the following claims and equivalents thereof.

What is claimed is:

1. A flat panel display comprising:
    a pixel portion in which a plurality of pixels are arranged; and
    driving circuit portions for driving the pixels,
    wherein the pixel portion comprises thin film transistors each having a more uniform output current over an operational range of input voltages than that of a floating-body thin film transistor having substantially similar characteristics, and the driving circuit portions comprise thin film transistors each having drain current-gate voltage characteristics such that a threshold voltage has a steeper slope than that of a floating-body thin film transistor having substantially similar characteristics.

2. The flat panel display according to claim 1, wherein each of the thin film transistors in the pixel portion is a source-body contact thin film transistor and comprises an active layer having a channel region and a body contact region for providing a predetermined voltage to the channel region, a gate electrode, a source electrode, and a drain electrode, and wherein the body contact region is connected to one of the source electrode and the drain electrode so that the predetermined voltage from the connected electrode can be provided to the channel region.

3. The flat panel display according to claim 2, wherein in each of the thin film transistors in the pixel portion, a drain current outputted via the drain electrode thereof is substantially uniform with respect to an input voltage applied to the drain electrode.

4. The flat panel display according to claim 1, wherein each of the thin film transistors in the driving circuit portions is a gate-body contact thin film transistor which comprises an active layer having a channel region and a body contact region for providing a predetermined voltage to the channel region, a gate electrode, a source electrode, and a drain electrode, and wherein the body contact region is connected to the gate electrode so that the predetermined voltage from the gate electrode can be provided to the channel region.

5. The flat panel display according to claim 4, wherein in each of the thin film transistors in the driving circuit portions, a drain current outputted via the drain electrode thereof has a suitable ON/OFF characteristic with respect to an input voltage applied to the gate electrode.

6. A flat panel display comprising:
    a pixel portion in which a plurality of pixels are arranged; and
    driving circuit portions for driving the pixels,
    wherein the pixel portion comprises thin film transistors each having a more uniform output current over an operational range of input voltages than that of a floating-body thin film transistor having substantially similar characteristics, and
    wherein the driving circuit portions comprise thin film transistors each comprising
        a channel region; and
        a body contact region electrically connected to a gate electrode for applying a voltage to the channel region.

* * * * *